US008059456B2

(12) United States Patent
Shlick et al.

(10) Patent No.: US 8,059,456 B2
(45) Date of Patent: Nov. 15, 2011

(54) PROGRAMMING A NAND FLASH MEMORY WITH REDUCED PROGRAM DISTURB

(75) Inventors: Mark Shlick, Ganei Tikva (IL); Mark Murin, Kfar Saba (IL)

(73) Assignee: SanDisk IL Ltd., Kfar Saba (IL)

( * ) Notice: Subject to any disclaimer, the term of this patent is extended or adjusted under 35 U.S.C. 154(b) by 176 days.

(21) Appl. No.: 11/806,111

(22) Filed: May 30, 2007

(65) Prior Publication Data

US 2008/0259684 A1    Oct. 23, 2008

Related U.S. Application Data

(60) Provisional application No. 60/864,607, filed on Nov. 7, 2006.

(51) Int. Cl.
*G11C 11/34* (2006.01)
*G11C 16/04* (2006.01)

(52) U.S. Cl. ......... 365/185.03; 365/185.24; 365/185.02; 365/185.18

(58) Field of Classification Search ............. 365/185.03, 365/185.02, 185.18, 185.24
See application file for complete search history.

(56) References Cited

U.S. PATENT DOCUMENTS

| 5,774,397 | A | 6/1998 | Endoh et al. |
| 5,943,260 | A * | 8/1999 | Hirakawa ............... 365/185.03 |
| 6,046,935 | A | 4/2000 | Takeuchi et al. |
| 6,288,935 | B1 * | 9/2001 | Shibata et al. ......... 365/185.03 |
| 7,196,928 | B2 | 3/2007 | Chen |
| 7,230,851 | B2 | 6/2007 | Fong |
| 7,649,784 | B2 * | 1/2010 | Cho et al. ............... 365/185.24 |
| 7,885,107 | B2 * | 2/2011 | Park et al. ............... 365/185.03 |
| 2002/0080660 | A1 | 6/2002 | Kanamitsu et al. |
| 2002/0191459 | A1 | 12/2002 | Tsujikawa et al. |
| 2003/0163634 | A1 * | 8/2003 | Kim ............................ 711/103 |
| 2004/0052114 | A1 * | 3/2004 | Kobayashi et al. ........... 365/199 |
| 2005/0169057 | A1 * | 8/2005 | Shibata et al. ........... 365/185.28 |
| 2006/0023538 | A1 * | 2/2006 | Nishihara et al. ........... 365/206 |
| 2007/0086244 | A1 * | 4/2007 | Zilberman .............. 365/185.09 |

OTHER PUBLICATIONS

International Search Report dated Mar. 25, 2008, PCT Appl. PCT/IL2007/001344, filed Nov. 4, 2007.
PCT International Preliminary Report of Patentability, dated May 12, 2009, PCT Patent Appl. PCT/IL2007/001344.
Declaration of Jeffrey W. Lutze, dated Sep. 25, 2009.
Data Sheet for Samsung K9XXG08UXM, dated Apr. 25, 2006.
Taiwanese Office Action dated Aug. 30, 2011, Taiwanese Patent Application No. 096141741, filed Nov. 5, 2007, 10 pages.

* cited by examiner

*Primary Examiner* — Tuan T Nguyen
*Assistant Examiner* — Lance Reidlinger
(74) *Attorney, Agent, or Firm* — Vierra Magen Marcus & DeNiro LLP

(57) ABSTRACT

When a memory device receives two or more pluralities of bits from a host to store in a nonvolatile memory, the device first stores the bits in a volatile memory. Then, in storing the bits in the nonvolatile memory, the device raises the threshold voltages of some cells of the volatile memory to values above a verify voltage. While those threshold voltages remain substantially at those levels, the device raises the threshold voltages of other cells of the volatile memory to values below the verify voltage. In the end, every cell stores one or more bits from each plurality of bits. Preferably, all the cells share a common wordline. A data storage device operates similarly with respect to storing pluralities of bits generated by an application running on the system.

12 Claims, 18 Drawing Sheets

PROGRAMMING A NAND FLASH MEMORY WITH REDUCED PROGRAM DISTURB

This patent application claims the benefit of U.S. Provisional Patent Application No. 60/864,607, filed Nov. 7, 2006

This application is related to U.S. patent application Ser. No. 11/806,108, now abandoned of the same inventors, which is entitled "PROGRAMMING A NAND FLASH MEMORY WITH REDUCED PROGRAM DISTURB" and filed on the same day as the present application. The latter application, also claiming priority from U.S. Provisional Patent Application No. 60/864,607, is incorporated in its entirety as if fully set forth herein.

FIELD AND BACKGROUND OF THE INVENTION

The present invention relates to programming flash memories and, more particularly, to a method of programming a flash memory such as a NAND flash memory with reduced program disturb.

Flash memory devices are used in various applications to store digital information. A basic flash cell consists of a transistor with a floating gate positioned between the channel and the transistor's control gate. The threshold voltage of the transistor is defined as the lowest voltage that, when applied to the control gate of the transistor, changes the channel state from a non-conducting state to a conducting state. This voltage is affected by the amount of negative charge trapped in the floating gate: the more charge, the higher the threshold voltage of the cell. SLC (Single Level Cell)-type devices use cells with zero charged floating gates to represent a "1" state and cells with negatively charged floating gates to represent a "0" state. The cell state can be represented by the cell's threshold voltage, in this case using two voltage levels, "1" state voltage and "0" state voltage. Although cells may have slightly different "0" state voltages, applying a voltage that is between the "1" state voltage and the "0" state voltage to the control gate causes the "1" state cells to conduct, but the "0" state cells stay in the non-conducting state.

The most common kind of Multi Level Cell (MLC)-type devices uses 4 charge amounts in the floating gate, including zero charge, so the cell state can be represented by 4 voltage levels, thus a MLC cell stores 2 bits per cell. Generally, N bits per cell can be represented using $2^N$ voltage levels. Using high number of bits per cell allows producing Flash devices with high data density and thus reduces the overall cost per Flash device.

A NAND Flash device consists of arrays of cells, called blocks. A block is built as a matrix in which the rows are word lines (WL) that connect the control gates of the cells, and each column is a chain of floating gate cells that are connected to a corresponding bit line (BL) on one side of the chain via a first select gate SGD, and on the other side of the chain to a common source line via a second select gate SGS. The SGD gates are connected to form a SGD line and the SGS gates are connected to form a SGS line, similar to the manner in which the control gates are connected to from the WL. An example of one block of a NAND Flash array with 8 WL's and 4256 BL's is shown in FIG. 1. Examples of such arrays are given in the following U.S. patents that are incorporated by reference for all purposes as if fully set forth herein: U.S. Pat. No. 5,774,397; U.S. Pat. No. 6,046,935. A physical page of such a memory includes the cells that have their transistor gates connected to the same WL. Each page in the example shown in FIG. 1 includes 4256 cells, so the block shown in FIG. 1 includes 8 pages of 4256 cells each, for a total of 34,048 cells.

During an erase operation of a NAND block the whole block is erased as described below, and program and read operations on NAND cells are done on a per-page basis. Consequently, for the purpose of the present invention a block of cells is defined as the smallest chunk of cells that are erased simultaneously, and a page of cells is defined as the smallest chunk of cells that are written (programmed) simultaneously. (For historical reasons, writing to a flash cell is called "programming" the cell. "Writing" and "programming" are used interchangeably herein.)

An erase operation involves applying a high voltage between the C-p-well (an area in the silicon structure of the Flash device that is located under the cells and that is common to all the cells) and all the WL's of the selected block, with the WL's being held at 0 voltage. This high voltage causes the affected floating gates to discharge any charge that was trapped in the floating gate by a previous programming operation, thus bringing the cells to the erased state.

A programming operation involves applying a high voltage to the selected WL and applying a lower voltage to other WL's so as to bring the other WL's to a conducting state. The BL's of the cells that are to be programmed are kept at 0 voltage so the cells are put under stress caused by the high voltage of the selected WL and 0 voltage of the BL's. The BL's of the cells that are not intended to be programmed are connected to a voltage level such that the stress caused by the difference between the BL's and the voltage applied to the WL is not enough to cause a change in the floating gate charges of the cells. The programming process is made up of a series of programming pulses, interleaved with verification operations in which each cell's target threshold voltage is applied to the cell gate to check if more charge should be trapped in the floating gate. If more charge needs to be trapped in any cell's floating gate, another programming pulse is applied with a slightly higher amplitude or longer duration than the preceding programming pulse. If the cell has reached its target threshold voltage, its further programming is inhibited by applying an appropriate voltage level to its BL, similar to the cells that are not intended to be programmed.

A read or verify process involves applying one or more reference voltage levels to a cell gate and checking whether the cell is conductive. This reference voltage is applied to the selected WL. The other WL's are connected to a read pass voltage that makes the other cells conductive, and the cell's chain's SGS line is held at conducting state to connect the chain to the C-source line, which is kept at 0 voltage. The BL is precharged with some voltage, and if the reference voltage applied to the selected WL is higher than the tested cell's threshold voltage, then the tested cell becomes conducting, which makes the whole chain conducting, and the precharged BL voltage decreases. If the reference voltage applied to the tested cell is lower than the tested cell's threshold voltage, then the tested cell prevents conducting through the chain of cells and the voltage applied to the BL stays at its precharged level. Sense amplifiers connected to the BL's make the decision about the cell's state. A reference voltage that is used to verify the correct programming of one or more memory cells is termed a "verify voltage" herein.

The read operation of a SLC device uses one reference voltage level that is between the "0" and "1" voltage levels. The read operation in a MLC device with 4 cell states uses 3 reference voltage levels, and a device that stores N bits per cell, that are represented by $2^N$ states, needs $2^N-1$ reference voltage levels for read operations.

Phenomena related to the Flash programming operation, such as cross coupling and program disturb, cause the actual threshold voltage distributions of a population of flash cells to take the form of $2^N$ voltage groups for an N-bits-per-cell device. An example of threshold voltage distributions in a device with 8 nominal threshold voltage levels is shown in FIG. 2. Ideally, the corresponding reference voltages for reading the cells of such a device should be between the voltage groups: $V_{R1}$, $V_{R2}$, $V_{R3}$, $V_{R4}$, $V_{R5}$, $V_{R6}$ and $V_{R7}$ as shown in FIG. 2.

The threshold voltage level groups should be separated for reliable read operation, and using a high number of voltage levels implies a larger difference between the lowest voltage level and the highest voltage level. High voltage levels require using a high programming pulse voltage applied to the WL during the programming operation, and this increases a program disturb effect as shown below.

A program operation puts a stress on the cells to be programmed, by applying a high voltage to the selected WL and 0 voltage to the selected BL, with the unselected WL's kept at conducting voltage and unselected BL's kept at some voltage that is lower than the programming voltage. Although all the gates of the selected page are connected to the high voltage applied to the selected WL, the programming stress is applied only to the cells at the intersections of the selected WL and the selected BL's, as the difference between the WL voltage and unselected BL's is lower than the difference between the WL voltage and the selected BL's. In an ideal device only the selected cells would change their floating gate charge during the programming operation, but in a real device the smaller stress between the selected WL and unselected BL's cause a small change in the charges on these floating gates too. This is known as the program disturb phenomenon and its effect is mainly seen in the low voltage level cells and is increased when using higher programming voltages. An example of a cell threshold voltage distribution after a programming operation that includes a program disturb effect is shown in FIG. 6 and is described below.

The following example illustrates the program disturb effect in a simplified situation in which the data to be programmed to a flash memory are to be represented by 8 voltage levels, #0 through #7. Different programming techniques exist, but they usually use a sequential increase of the programming voltage to program the different voltage levels, so this example assumes programming level #1, then #2, and so on till #7. This example also assumes that the cells to be programmed to the level #N are first programmed to levels #1 through #(N−1) and then using higher programming voltages these cells are programmed to level #N. The example assumes that the user data are represented by all 8 voltage levels and the user data are evenly distributed among these 8 levels.

The programming starts with all cells in the erased state, as shown in FIG. 3. The voltage distribution after programming the level #1 is shown in FIG. 4, where the level #1 includes the cells that are to be programmed to level #1 and also the cells that are to be programmed to levels #2 through #7. The BL's of the cells that are to be programmed to level #1 are put in an inhibit state after these cells reach their target charge in their floating gates. FIG. 5 shows the voltage distribution after programming to level #2, where the level #2 includes the cells that are to be programmed to level #2 and also the cells that are to be programmed to levels #3 through #7. The voltage distribution after programming level #7 is shown in FIG. 6, where the widening and shifting of the low level distributions, such as distributions #0 and #1, is caused mainly by the program disturb phenomenon when programming high levels such as levels #6 and #7. It can be seen that some of the level #1 cells have become level #2 cells, so when the data are read from the flash they will be read with errors. Various techniques try to adjust the voltage levels being programmed so the final voltage distribution is narrow and in the right place, but the fact that the program disturb effect depends on the data content that is programmed makes it difficult to design a proper technique that works for all data patterns. For example the location of the level #1 could be set to a lower voltage first, so the program disturb caused by the programming the levels #6 and #7 would bring the #1 distribution to the right position, but this technique would fail for a page that does not include data represented by levels #6 and #7, as in this case the program disturb effect caused by the lower levels is much smaller, and some of the #1 cells would be read as #0 cells.

There is thus a widely recognized need for, and it would be highly advantageous to have, a method of programming flash cells that overcomes the disadvantages of presently known methods as described above.

SUMMARY OF THE INVENTION

The present invention is a technique for multiple-bits-per-cell Flash device programming that reduces the program disturb effect.

According to the present invention there is provided a method of storing data in a memory device, including the steps of: (a) receiving, from a host of the memory device, at least two pluralities of bits to store in a plurality of cells of a nonvolatile memory of the memory device; (b) storing the at least two pluralities of bits in a volatile memory of the memory device; and (c) subsequent to the storing of the at least two pluralities of bits in the volatile memory, storing the at least two pluralities of bits in the plurality of cells, by steps including: (i) raising a threshold voltage of a first at least one of the cells to a first value that is greater than a verify voltage; and (ii) while the threshold voltage of each first at least one cell remains substantially at the first value, raising a threshold voltage of a second at least one of the cells to a second value that is less than the verify voltage; wherein at least one bit of each of the pluralities of bits is stored in at least one of the cells.

According to the present invention there is provided a memory device including: (a) a nonvolatile memory that includes a plurality of cells; (b) a volatile memory; and (c) a controller operative, in response to receiving, from a host of the memory device, at least two pluralities of bits to store in the memory device: (i) to store the at least two pluralities of bits in the volatile memory, and (ii) subsequent to the storing of the at least two pluralities of bits in the volatile memory: to store the at least two pluralities of bits in the plurality of cells by steps including: (A) raising a threshold voltage of a first at least one of the cells to a first value that is greater than a verify voltage, and (B) while the threshold voltage of each first at least one cell remains substantially at the first value, raising a threshold voltage of a second at least one of the cells to a second value that is less than the verify voltage, wherein at least one bit of each of the pluralities of bits is stored in at least one of the cells.

According to the present invention there is provided a method of storing data, including: (a) storing at least two pluralities of bits in a volatile memory of a memory device; and (b) subsequent to the storing of the two pluralities of bits in the volatile memory, storing the at least two pluralities of bits in a plurality of cells of a nonvolatile memory of the memory device by steps including: (i) raising a threshold voltage of a first at least one of the cells to a first value that is greater than a verify voltage, and (ii) while the threshold voltage of each first at least one cell remains substantially at the first value, raising a threshold voltage of a second at least one of the cells to a second value that is less than the verify voltage; wherein at least one bit of each of the pluralities of bits is stored in at least one of the cells.

According to the present invention there is provided a system including: (a) a memory device including: (i) a volatile memory, and (ii) a first nonvolatile memory including a plurality of cells; (b) a second nonvolatile memory wherein is stored code of a software driver for the first nonvolatile memory, the code including code for storing at least two pluralities of bits in the first nonvolatile memory by steps including: (i) storing the at least two pluralities of bits in the volatile memory, and (ii) subsequent to the storing of the at least two pluralities of bits in the volatile memory, storing the at least two pluralities of bits in the plurality of cells by steps including: (A) raising a threshold voltage of a first at least one of the cells to a first value that is greater than a verify voltage, and (B) while the threshold voltage of each first at least one cell remains substantially at the first value, raising a threshold voltage of a second at least one of the cells to a second value that is less than the verify voltage, wherein at least one bit of each of the pluralities of bits is stored in at least one of the cells; and (c) a processor for executing the code.

The first basic method of the present invention is a method of storing data in a memory device. The memory device receives, from a host thereof, two or more pluralities of bits to store in cells of a nonvolatile memory of the memory device. First, the pluralities of bits are stored in a volatile memory of the memory device. Subsequently, the pluralities of bits are stored in a plurality of cells of the nonvolatile memory. Storing the bits in the cells of the nonvolatile memory includes raising a threshold voltage of each of a first one or more of the cells to a first value that is greater than a verify voltage and then, while the threshold voltage(s) of the first cell(s) remain(s) substantially at the first value(s), raising a threshold voltage of each of a second one or more of the cells to a second value that is less than the verify voltage. That the threshold voltage of a cell remains "substantially" at a certain value means that any changes to the threshold voltage are sufficiently minor that the threshold voltage remains within a single threshold voltage level group. At least one bit of each plurality of bits is stored in at least one of the cells. The latter limitation distinguishes the present invention from prior art memory devices that use write caching. In such prior art devices, a first plurality of bits is stored in a first volatile memory prior to being transferred to a first plurality of cells of a nonvolatile memory; and if a second plurality of bits to be stored in a second plurality of the cells arrives before the first plurality of bits have been transferred to the first plurality of cells, the second plurality of bits is stored in a second volatile memory pending the completion of the transfer of the first plurality of bits.

The second basic method of the present invention is similar to the first basic method, but lacks the step of receiving the pluralities of bits from a host of the memory device, so that this basic method is amenable to being implemented by the host of the memory device as well as by the memory device itself. First, two or more pluralities of bits are stored in a volatile memory of the memory device. Subsequently, the pluralities of bits are stored in a plurality of cells of a nonvolatile memory of the memory device, in the same manner as in the first basic method.

Preferably, at least one bit of each plurality of bits is stored in each one of the cells.

Preferably, the cells share a common wordline of the nonvolatile memory.

Preferably, in the first method, each plurality of bits is sent by the host in a separate respective command. For example, if the host sends two pluralities of bits to the memory device by sending a sequence of the form "programming prefix opcode, address page-1, data page-1, dummy programming suffix opcode, address page-2, data page-2, programming suffix opcode", the two pluralities of bits are considered to be sent by two commands because the dummy programming suffix opcode separates the fields that define the first plurality of bits (address page-1, data page-1) from the fields that define the second plurality of bits (address page-2, data page-2).

Preferably, as in the "simultaneous programming example" discussed below, the storing of the two or more pluralities of bits in the cells results in a respective bit pattern being stored in each of the one or more cells wherein are stored at least one bit from each plurality of bits. Alternatively, as in the "sequential programming example" discussed below, the storing of the two or more pluralities of bits in the cells results in only a portion of a respective bit pattern being stored in each of the one or more cells wherein are stored at least one bit from each plurality of bits.

The scope of the present invention also includes a memory device that includes nonvolatile memory with a plurality of cells, a volatile memory and a controller for programming the cells, in response to receiving two or more pluralities of bits from a host, using the first method of the present invention. Preferably, the cells are NAND flash cells.

The scope of the present invention also includes a system that includes a memory device with a volatile memory and a first nonvolatile memory that includes a plurality of cells, and that also includes a second nonvolatile memory wherein is stored code of a software driver that implements the second method of the present invention, and that also includes a processor for executing the code. Preferably, the first nonvolatile memory is a NAND flash memory.

In the examples below, the "pluralities" of bits are "logical pages" of bits. A logical page of bits is understood herein to mean a group of bits equal in number to the number of cells in a physical page, so that a physical page of N-bit-per-cell cells can store up to N logical pages. Flash memory devices typically are configured to receive one logical page of bits at a time from their hosts. In one class of MLC flash memory devices the device stores the logical pages in its flash memory as the logical pages arrive. In another class of MLC flash memory devices, the device accumulates logical pages in a local nonvolatile memory such as a RAM or a set of registers until at least two logical pages' worth of bits have been accumulated (almost always until a full physical page's worth of bits have been accumulated) and then programs a physical page of its flash memory to store all the accumulated bits. The present invention is directed at the second class of MLC flash memory devices.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of flash memory programming according to the present invention may be better understood with reference to the drawings and the accompanying description.

The main idea of the present invention is to split the programming operation into two or more phases, in which programming the high voltage levels is followed by programming the low voltage levels. The program disturb effect is very dependent on the difference of the voltage levels, so the highest shift of voltage distribution is when programming the highest voltage level and the lower voltage levels are most affected. The program disturb associated with the first phase of programming the high levels affects mostly the cells that are in the erased state. Usually the final voltage levels include the erased state, so its distribution widening is taken into account when setting the reference levels.

Referring again to the drawings, an example of a programming operation of an 8-level cell device, which programming operation is split into two parts to reduce the program disturb effect, is shown in FIGS. 7 through 11.

Figure 7:
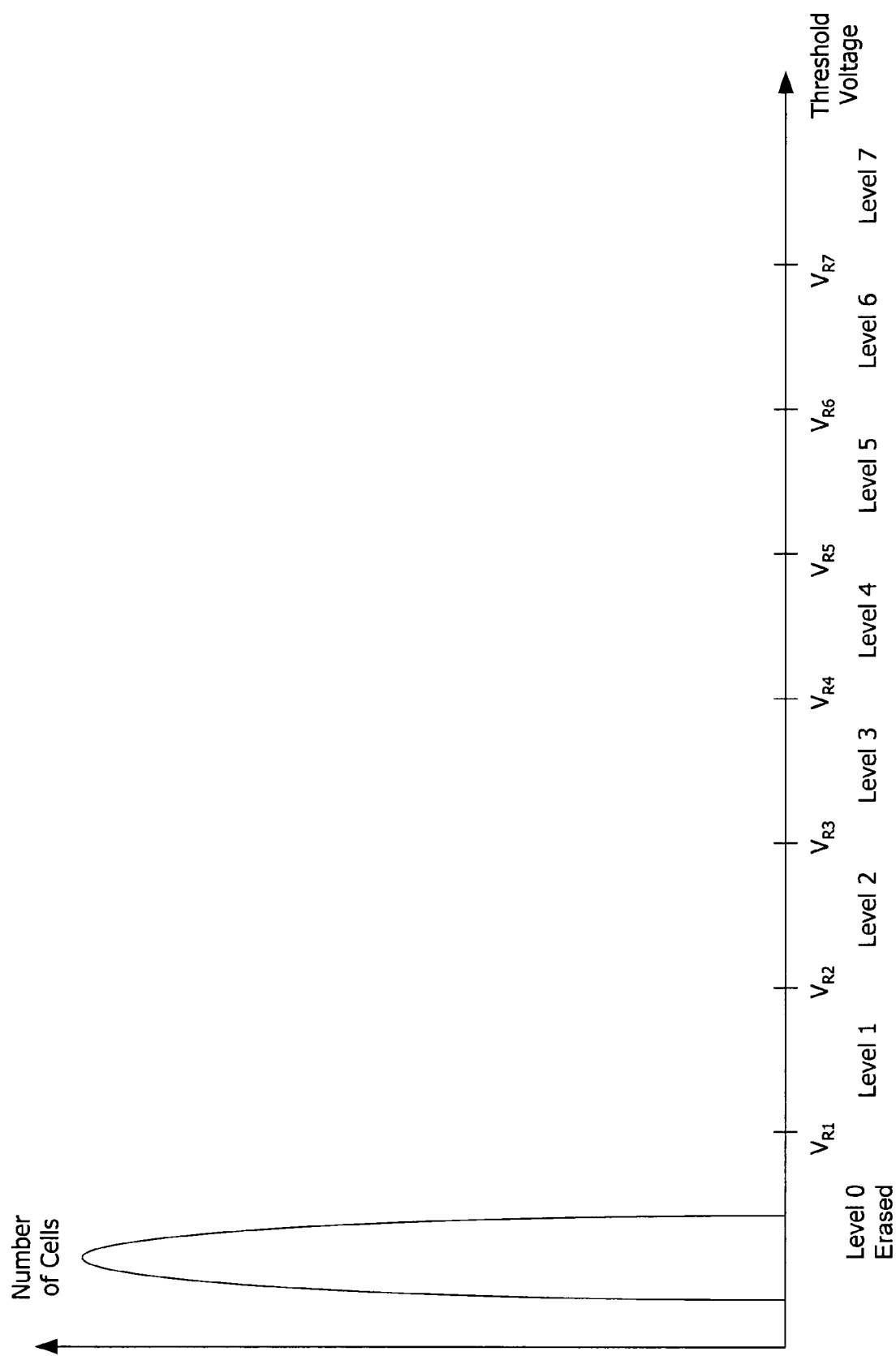
FIGS. 7-11 illustrate programming the cells of a NAND word line according to the present invention.

Before the programming operation, all the cells are in the level #0, the erased state, as shown in FIG. 7.

Figure 8:
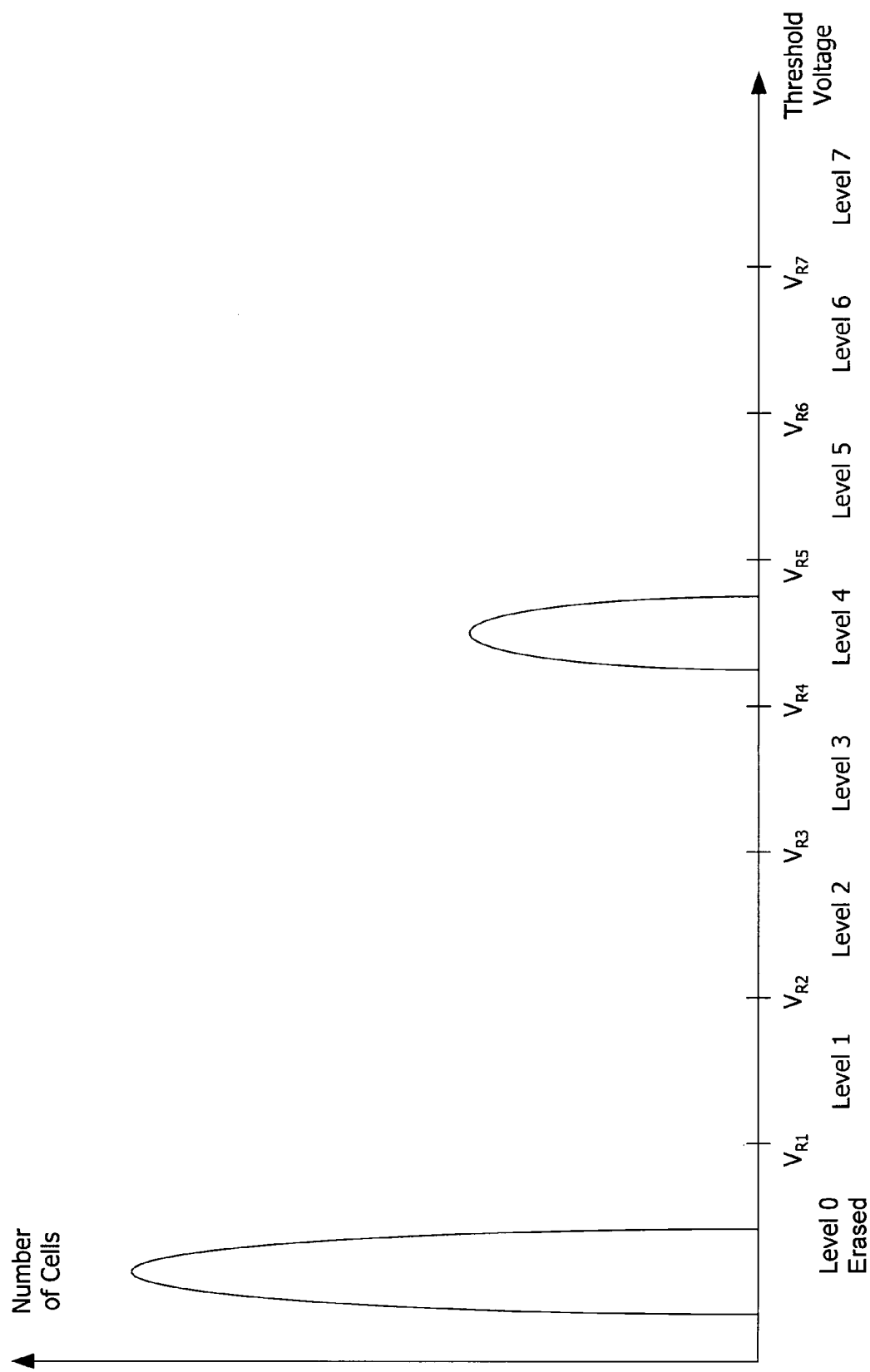
Figure 9:
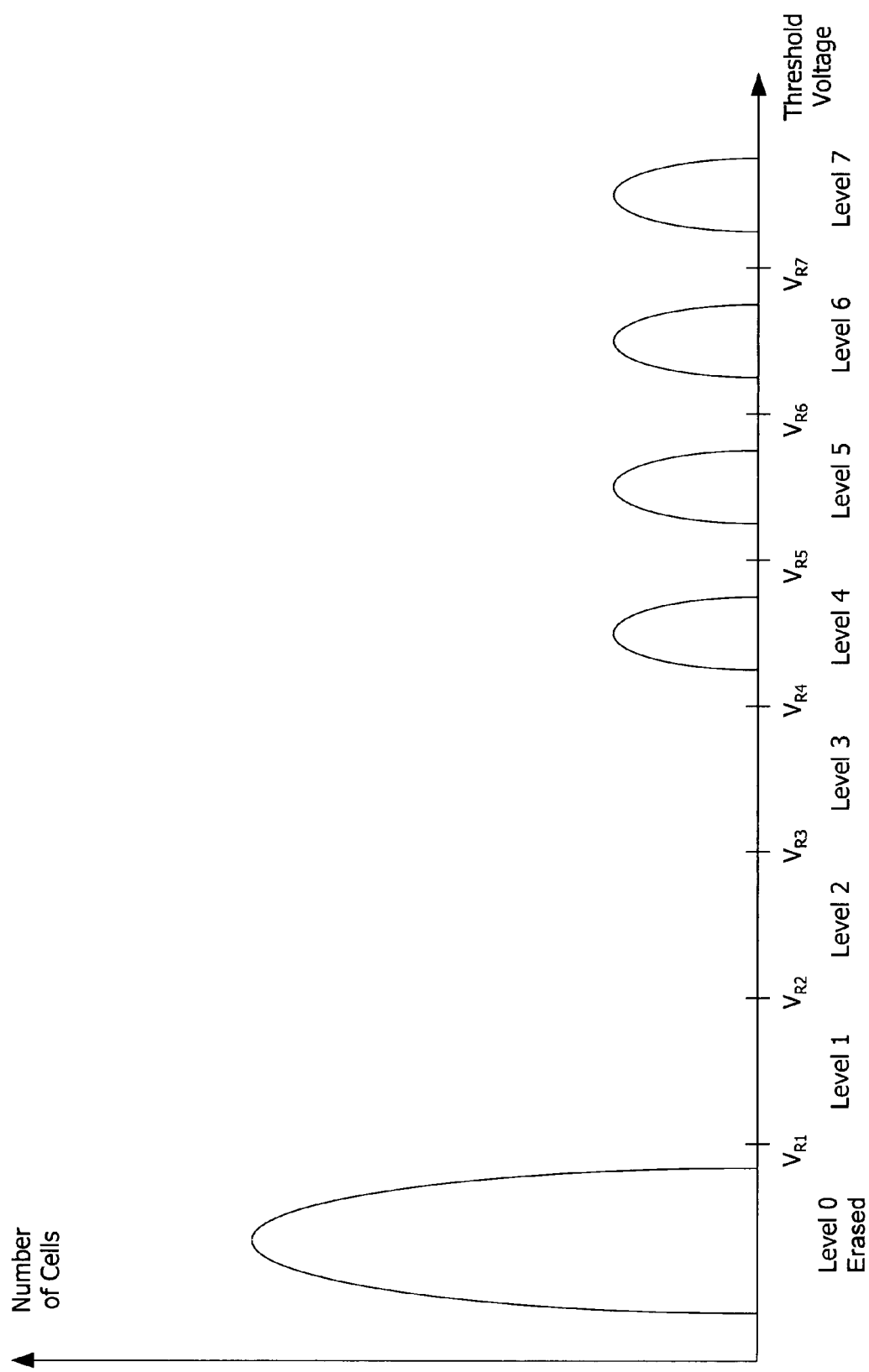

The first phase of the programming uses high voltages to program the levels #4 through #7. The cells' voltage distribution after programming the level #4 is shown in FIG. 8. The cells now at level #4 are the cells that are to be programmed to level #4 and higher, in this example levels #5, #6 and #7. The distribution after programming levels #4 through #7 is shown in FIG. 9. Applying high voltages for programming levels #6 and #7 has caused the cell distribution of the erased state to become wider due to program disturb effect as shown in FIG. 9.

Figure 10:
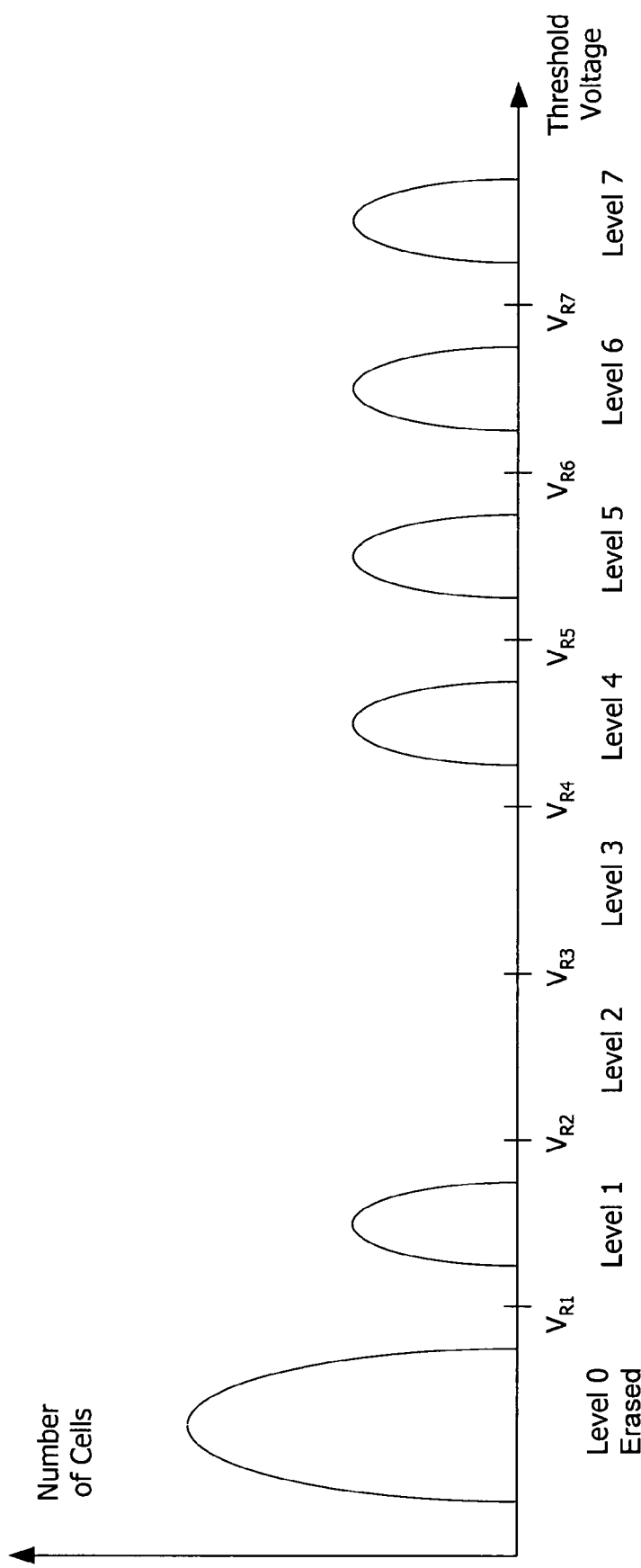
Figure 11:
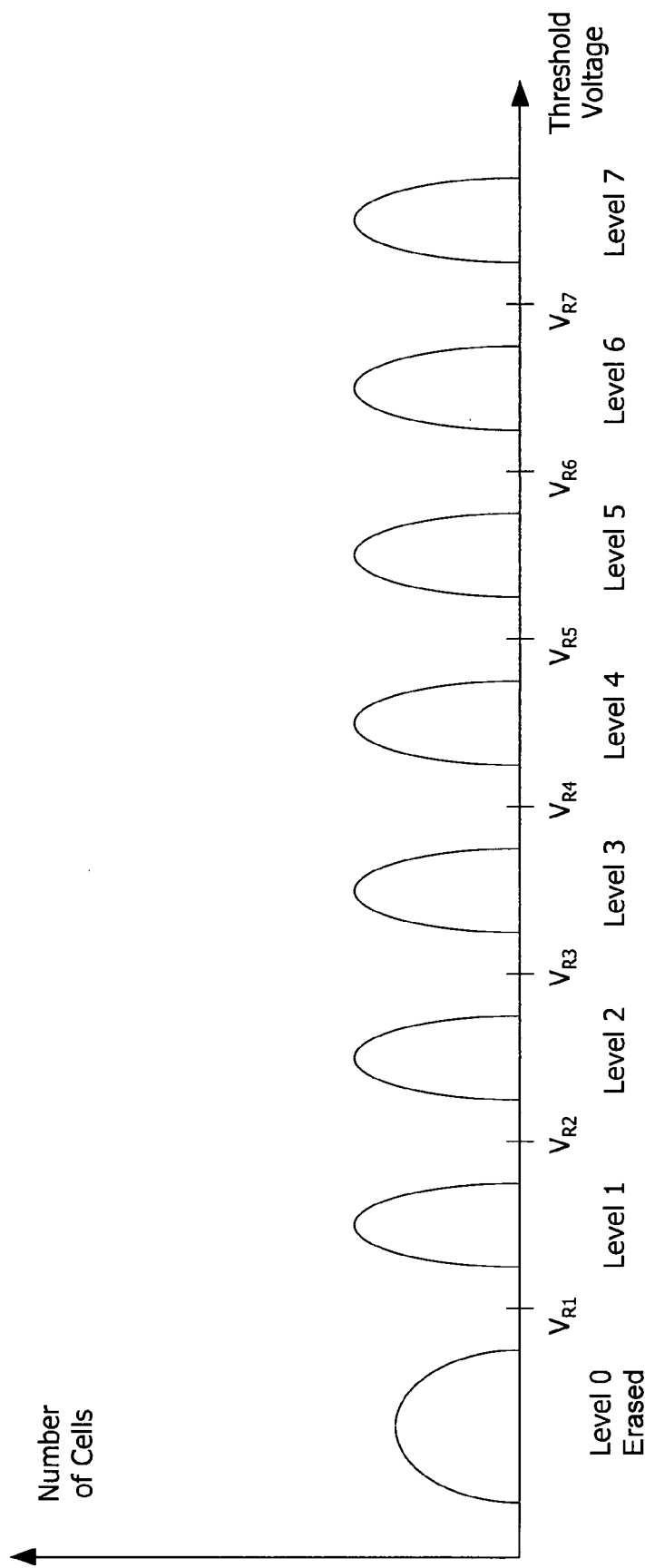

The second phase of the programming operation uses only lower programming voltages, as this phase programs only levels #1 to #3, so the program disturb effect on the lower levels is minimized. The voltage distribution after programming the level #1 is shown in FIG. 10, and the distribution after programming levels #2 and #3 is shown in FIG. 11. The lower levels, such as levels #1 and #2, are programmed after the programming of the high levels, such as levels #6 and #7, so the low level cell have not been affected by the program disturb effect. Furthermore, the second phase made only a small change to the width of the level #0 distribution, which is not perceptibly wider in FIG. 11 than in FIG. 9.

The essence of the present invention is that while writing a physical page of cells, the cells of the page that are to be set to high threshold voltages are programmed before programming the cells of the page that are to be set to low threshold voltages. This ordering of the programming of cells according to their target states is innovative and counter to the common art in which the programming progresses from low threshold states to high threshold states. It is this non-standard ordering that provides the benefit of reduction in program-disturb effects.

Although the description above is in reference to a basic architecture of MLC NAND devices, the present invention also is applicable to more complex MLC flash device architectures used in prior art devices. The following should be noted.

A. The above example is a case in which there is a one-to-one correspondence between a word line and a page. In some devices there are multiple pages (typically two pages, as in the configurations called "dual plane pages" and "even and odd pages") sharing the same word line. Note that these pages are physical pages defined by the flash memory device, not logical pages defined by the host of the flash memory device. As each of those pages can be independently written, the methods of the present invention apply to the writing of each such page, regardless of whether the page occupies a full word line or shares its word line with one or more other pages.

B. The above example is a case in which all data bits sharing an MLC cell are simultaneously written into the cell. In other words, there is no stable state in which the cell stores less than its maximum bits capacity. In some devices the bits of a cell are written into the cell one by one, so that there are situations when some of the bits are already stored while other bits are still to be stored. One common example in which such approach is preferable is when the user of the flash device provides the bits to be written sporadically, with long time intervals between the provision of successive groups of bits, so that it is advantageous to be able to store into the cell whatever bits are already available. For the purpose of the present invention the first method of simultaneously writing all bits is called "simultaneous writing" or "simultaneous programming", while if at least one bit is stored in the cell sequentially to at least one other bit, the method is called "sequential writing" or "sequential programming". The methods of the present invention are applicable both to simultaneous writing methods and separately to each one of the stages of sequential writing methods where each stage of the sequential writing is itself written using simultaneous writing in case two or more bits are stored per cell in that stage.

To illustrate sequential writing vs. simultaneous writing, the following table shows one way of identifying each of levels #0 through #7 with a respective bit pattern for representing the integers between 0 and 7 as binary numbers:

| | Level # | | | | | | | |
|---|---|---|---|---|---|---|---|---|
| | 0 | 1 | 2 | 3 | 4 | 5 | 6 | 7 |
| Bit pattern | 111 | 110 | 101 | 100 | 011 | 010 | 001 | 000 |

Figure 14A:
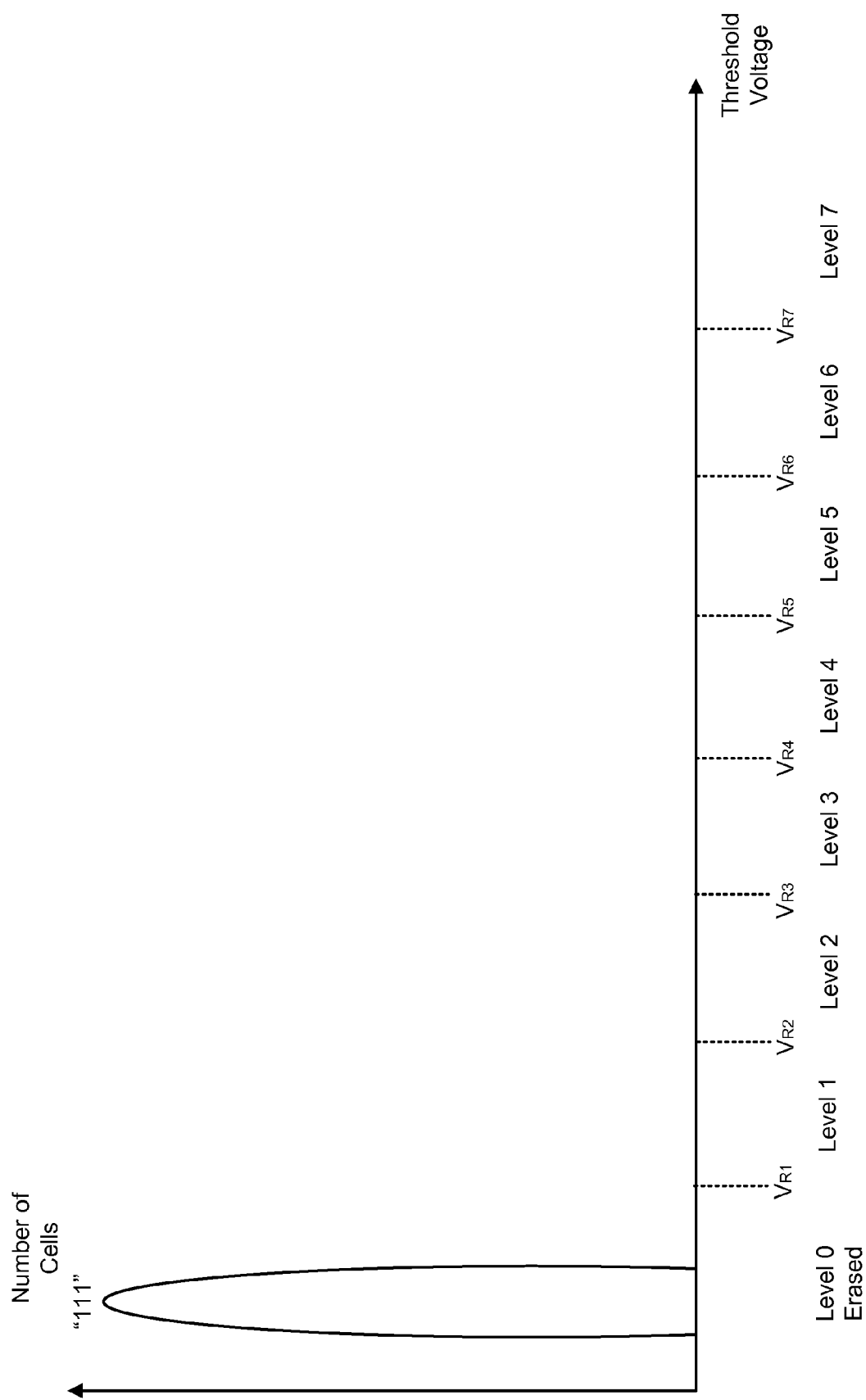
FIGS. 14A-14E illustrate programming NAND cells with two or more bits per cell simultaneously according to an embodiment of the present invention.
Figure 14B:
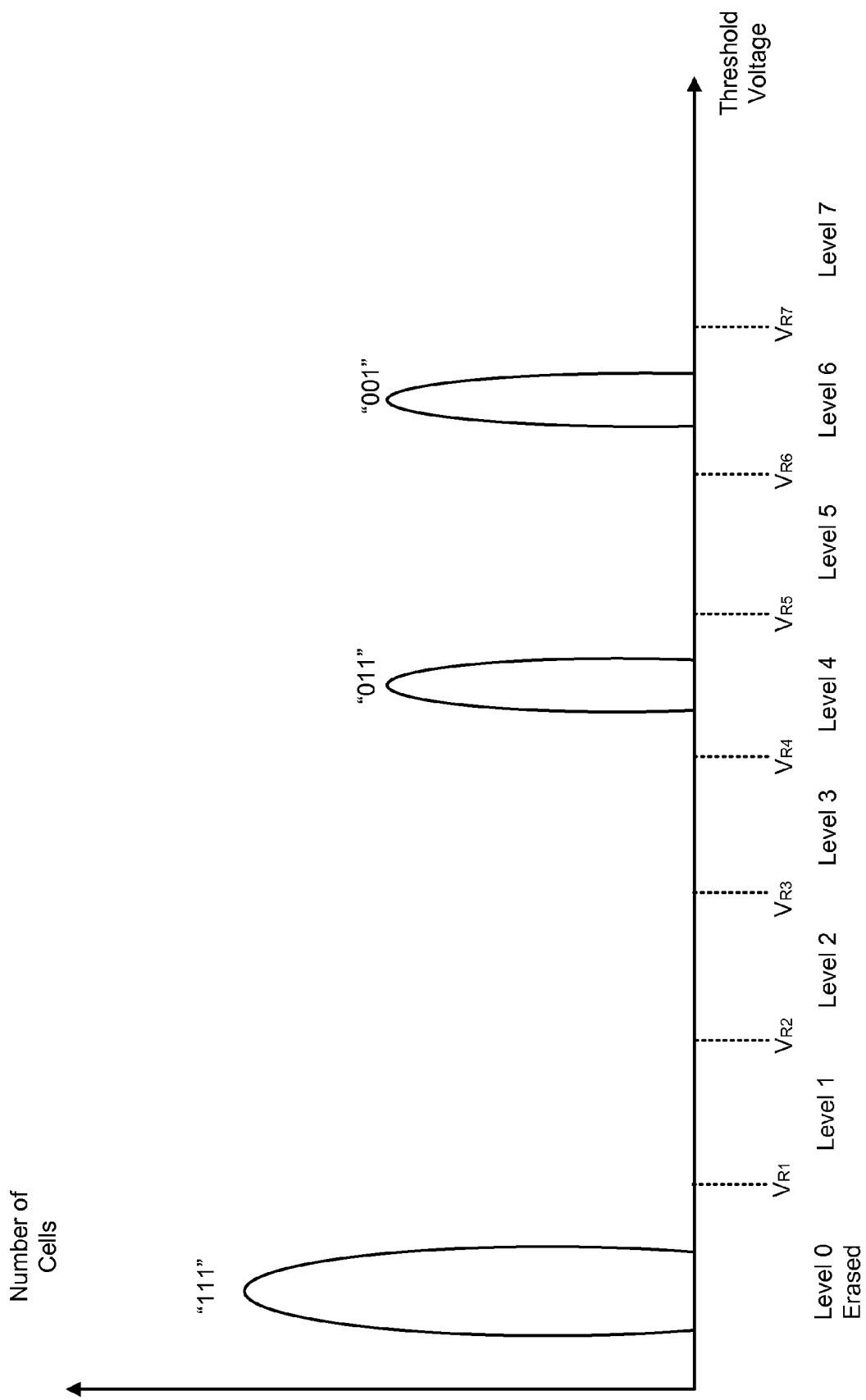
Figure 14C:
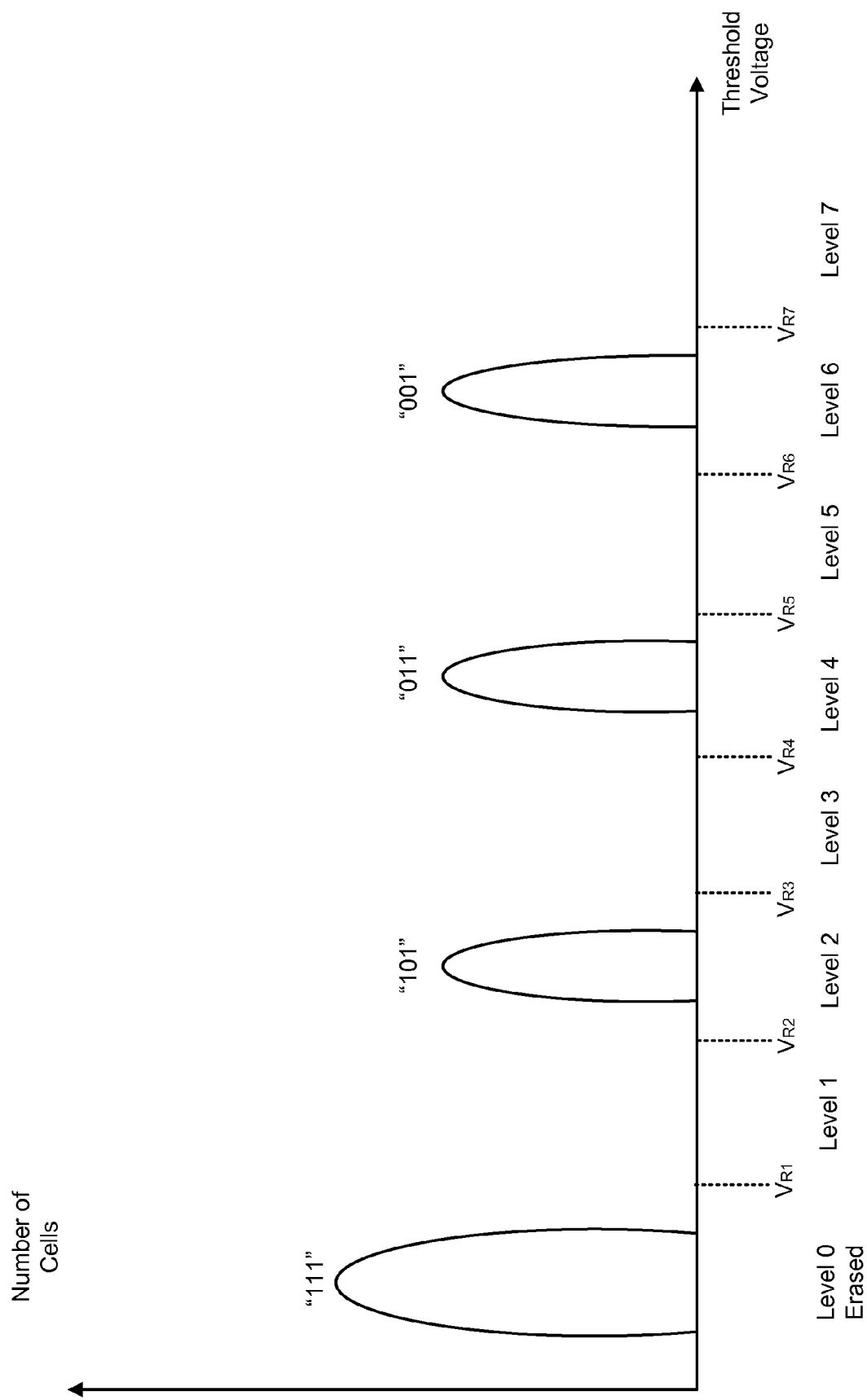
Figure 14D:
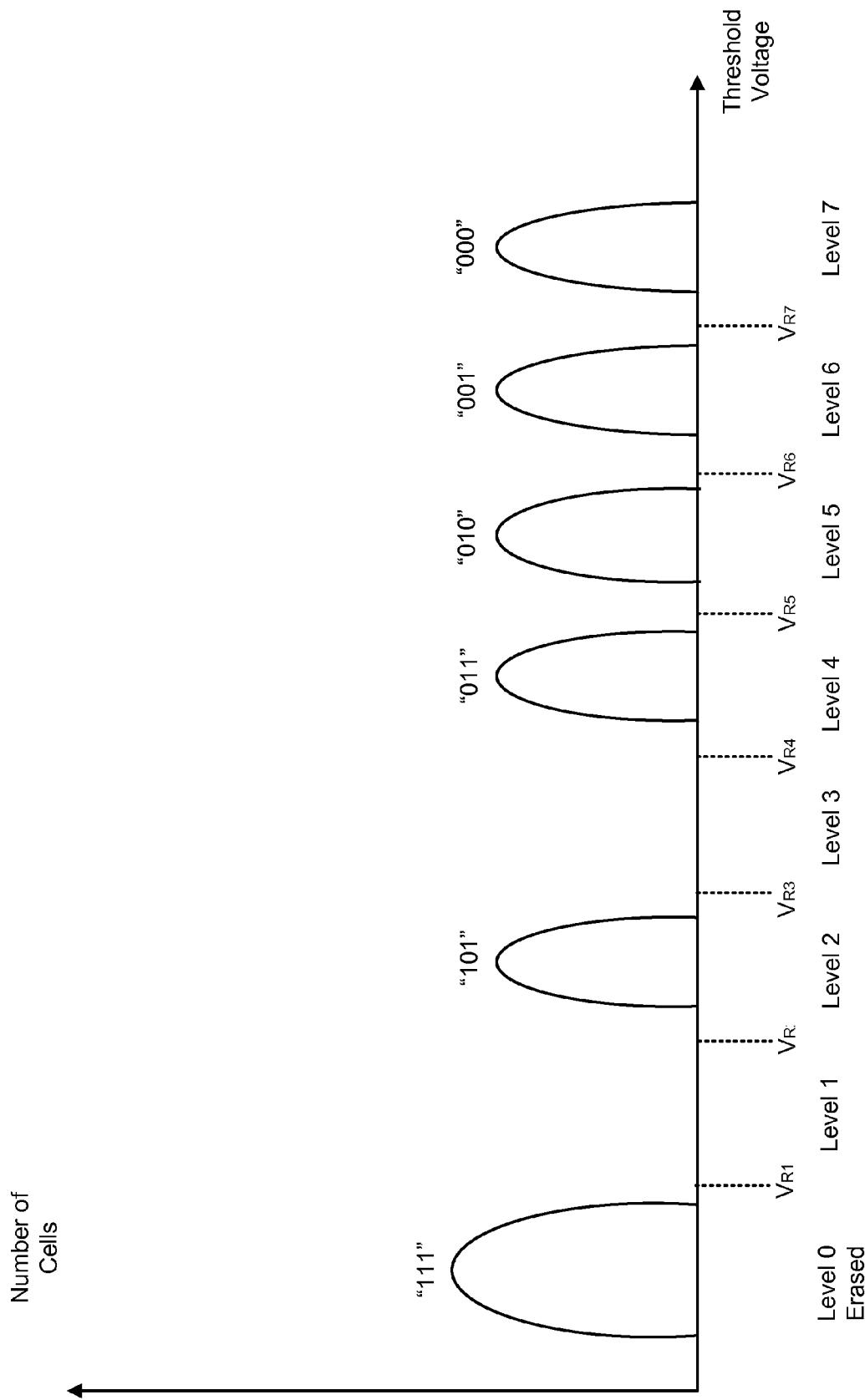
Figure 14E:
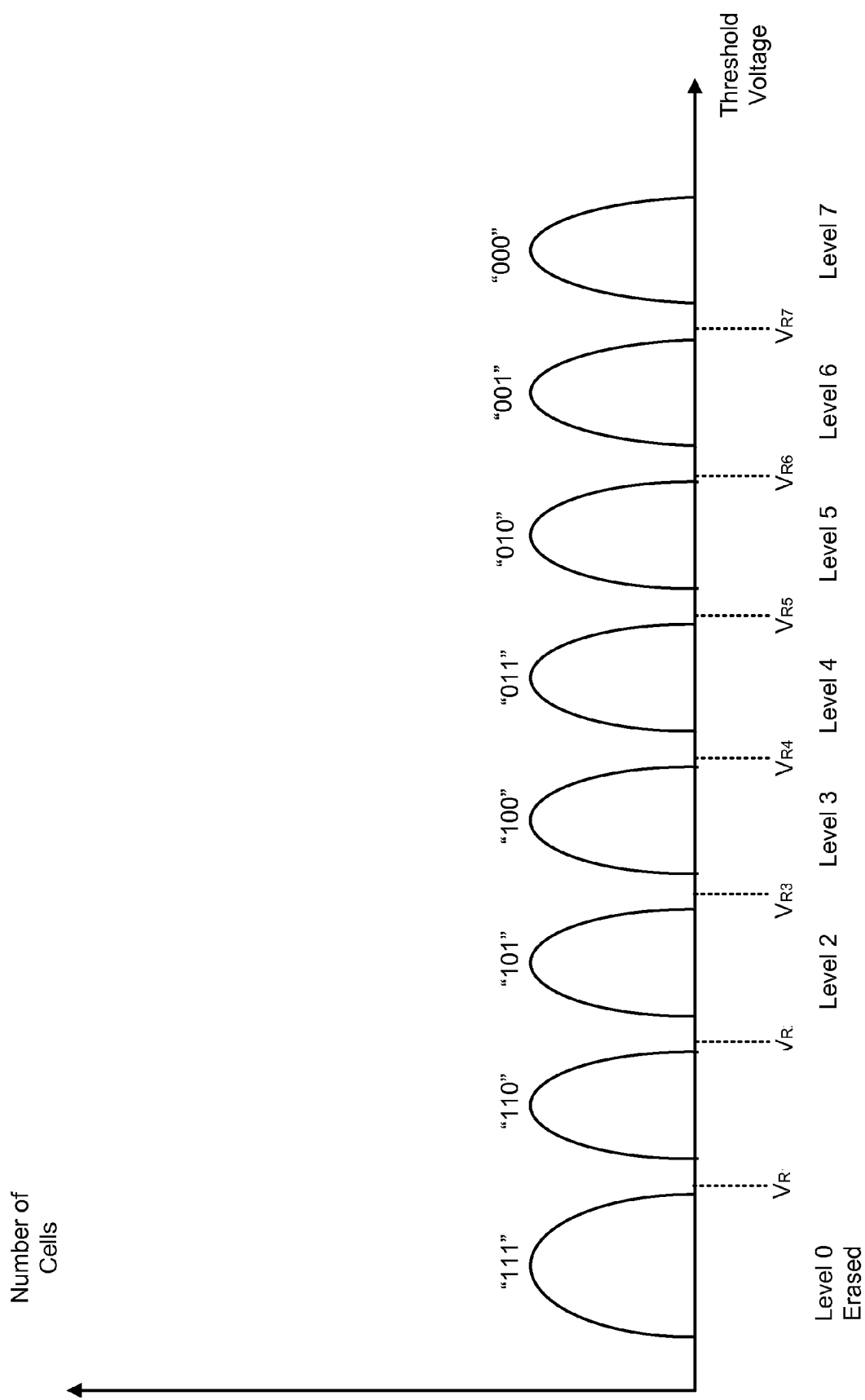

FIGS. 14A-14E illustrate programming NAND cells with two or more bits per cell simultaneously according to an embodiment of the present invention. FIG. 14A illustrates the erased state (e.g. like in FIG. 7) before the programming operation when the cells to be programmed are all at level #0, the erased state. In the following discussion, it is assumed that in a bit pattern of three bits, the rightmost bit is the least significant bit and the leftmost bit is the most significant bit. Suppose that an application generates 8512 data bits (two logical pages of 4256 bits each) at a time, for storage in two physical pages of 4256 eight-level flash cells per physical page. When the first 8512 data bits are generated, these bits are stored as the two most significant bits of the cells of the first physical page. As illustrated in FIG. 14B, in the first programming phase, cells that are to store most significant "00" are programmed to level #6 and cells that are to store most significant "10" are programmed to level #4. As illustrated in FIG. 14C, in the second programming phase, cells that are to store most significant "01" are programmed to level #2. Cells that are to store most significant "11" remain unprogrammed. When the next 8512 data bits are generated, the second physical page is programmed similarly (See FIGS. 14B and 14C). When the third 8512 data bits are generated, these bits are stored as the least significant bits of the bit patterns of both physical pages, as follows. First, as illustrated in FIG. 14D, cells that have been programmed to level #6 and that need to store least significant "0" bits are programmed to level #7, and cells that have been programmed to level #4 and that need to store least significant "0" bits are programmed to level #5. Finally, as illustrated in FIG. 14E, cells that have been programmed to level #2 and that need to store least significant "0" bits are programmed to level #3, and unprogrammed cells that need to store least significant "0" bits are programmed to level #1.

Of course, if the application generates 12,768 data bits (three logical pages of 4256 bits each) at a time, the bits are stored simultaneously, as illustrated in FIGS. 7 through 11. In the first programming phase, the cells that need to be programmed to store "011" are programmed to level #4; the cells that need to be programmed to store "010" are programmed to level #5; the cells that need to be programmed to store "001" are programmed to level #6; and the cells that need to be programmed to store "000" bits are programmed to level #7. In the second programming phase, the unprogrammed cells that need to be programmed to store "110" are programmed to level #1; the unprogrammed cells that need to be programmed to store "101" are programmed to level #2; and the unprogrammed cells that need to be programmed to store "100" are programmed to level #3.

In the latter example, the following Gray code bit assignment may be used to reduce the number of bit errors in case of incorrect reading due to threshold distribution shifts:

|             | Level # |     |     |     |     |     |     |     |
|-------------|-----|-----|-----|-----|-----|-----|-----|-----|
|             | 0   | 1   | 2   | 3   | 4   | 5   | 6   | 7   |
| Bit pattern | 111 | 110 | 100 | 101 | 001 | 000 | 010 | 011 |

In the first programming phase, the cells that need to be programmed to store "001" are programmed to level #4; the cells that need to be programmed to store "000" are programmed to level #5; the cells that need to be programmed to store "010" bits are programmed to level #6; and the cells that need to be programmed to store "011" are programmed to level #7. In the second programming phase, the unprogrammed cells that need to be programmed to store "110" are programmed to level #1; the unprogrammed cells that need to be programmed to store "100" bits are programmed to level #2; and the unprogrammed cells that need to be programmed to store "101" are programmed to level #3.

Figure 1:
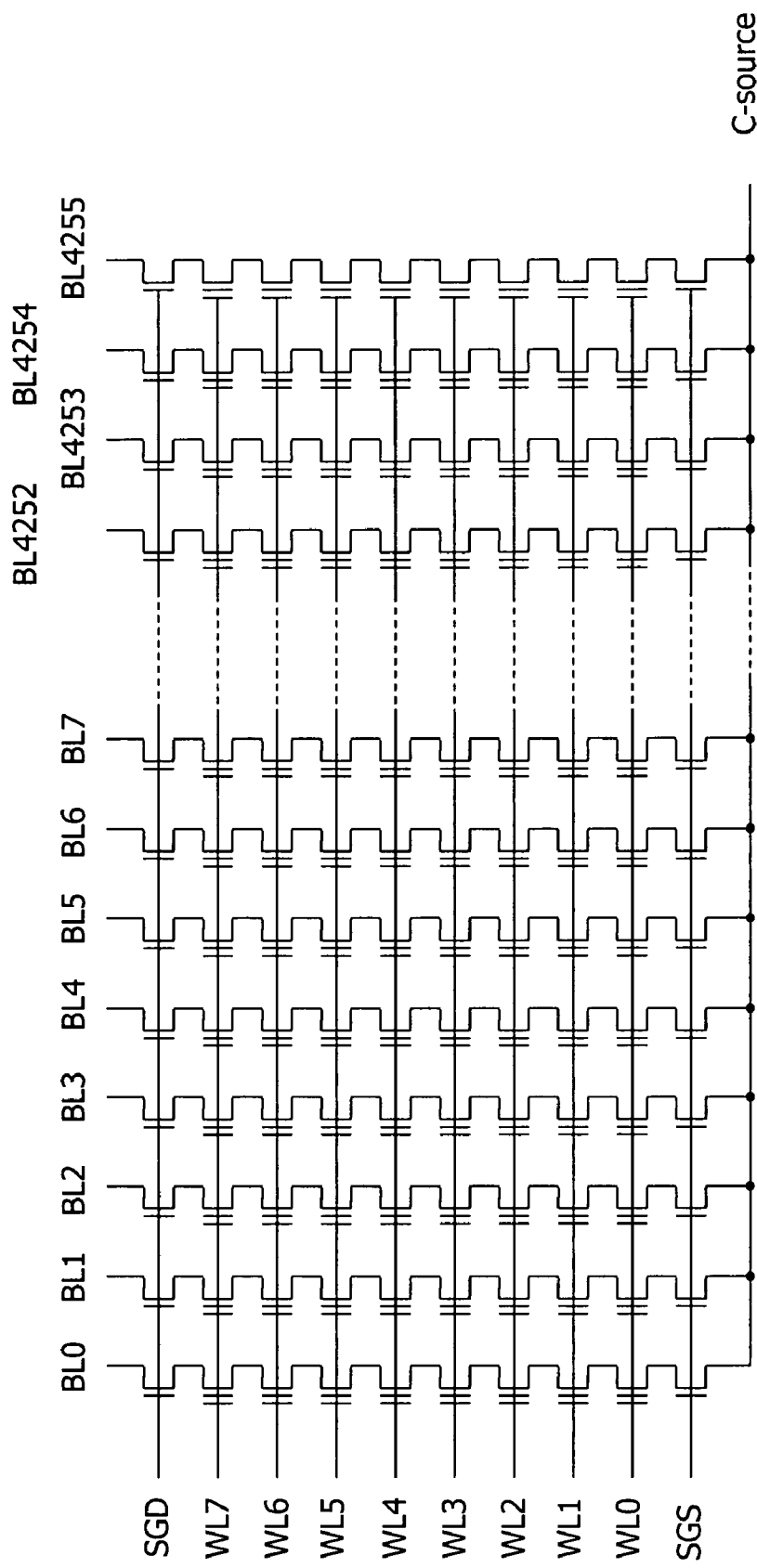
FIG. 1 is a schematic diagram of a NAND flash cell block.
Figure 2:
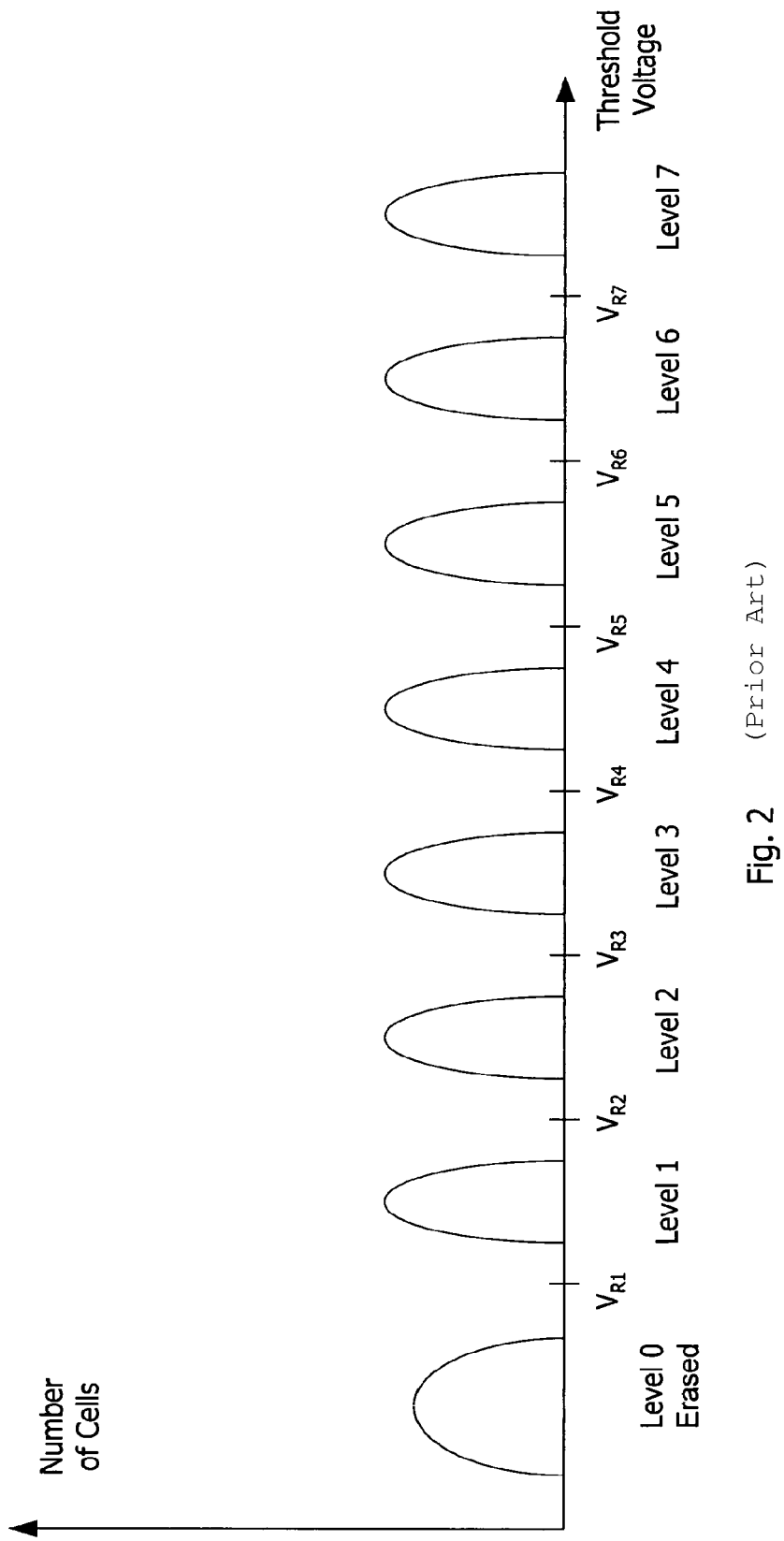
FIGS. 2-6 illustrate programming the cells of a NAND word line according to the prior art.
Figure 3:
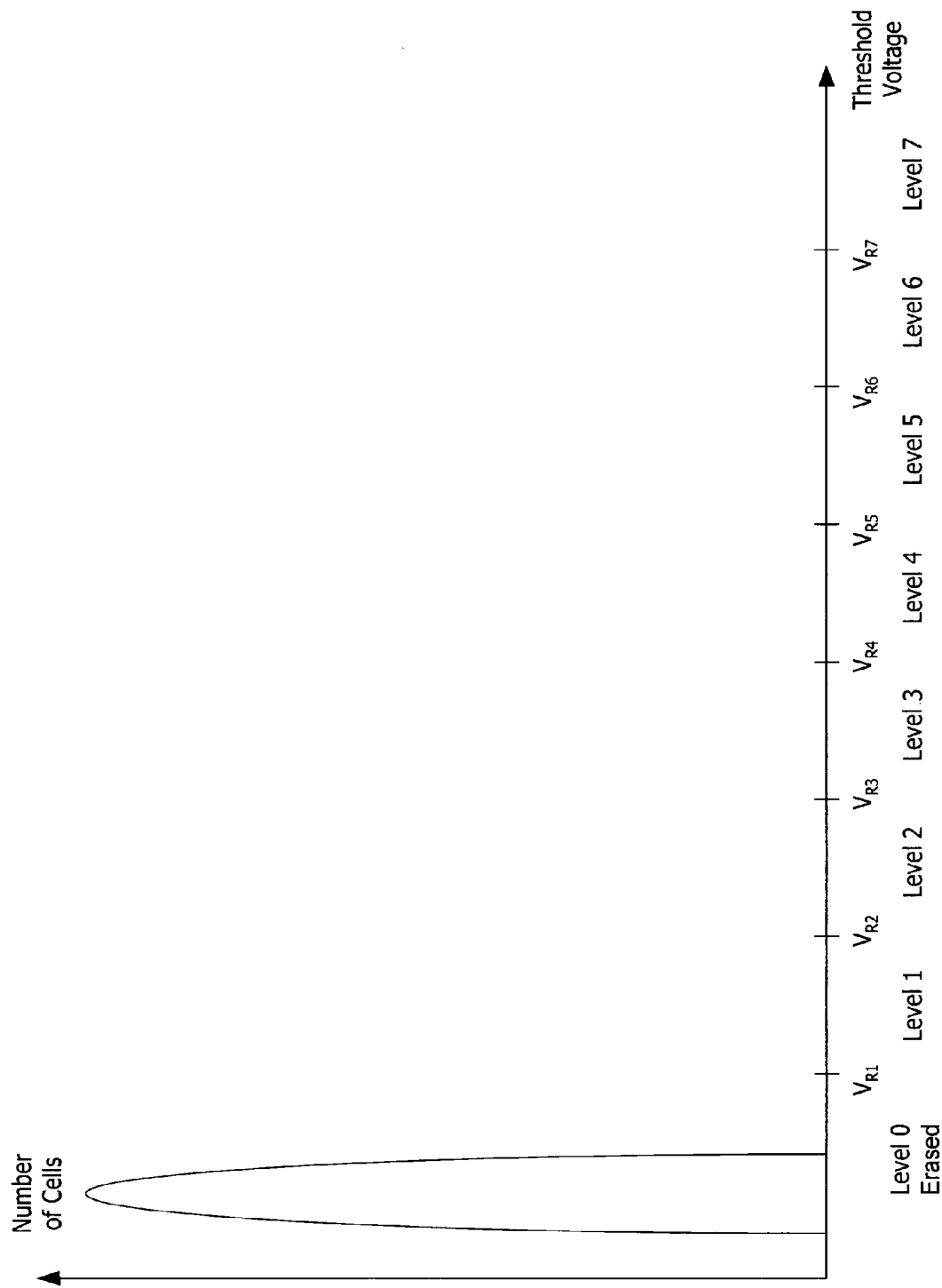
Figure 4:
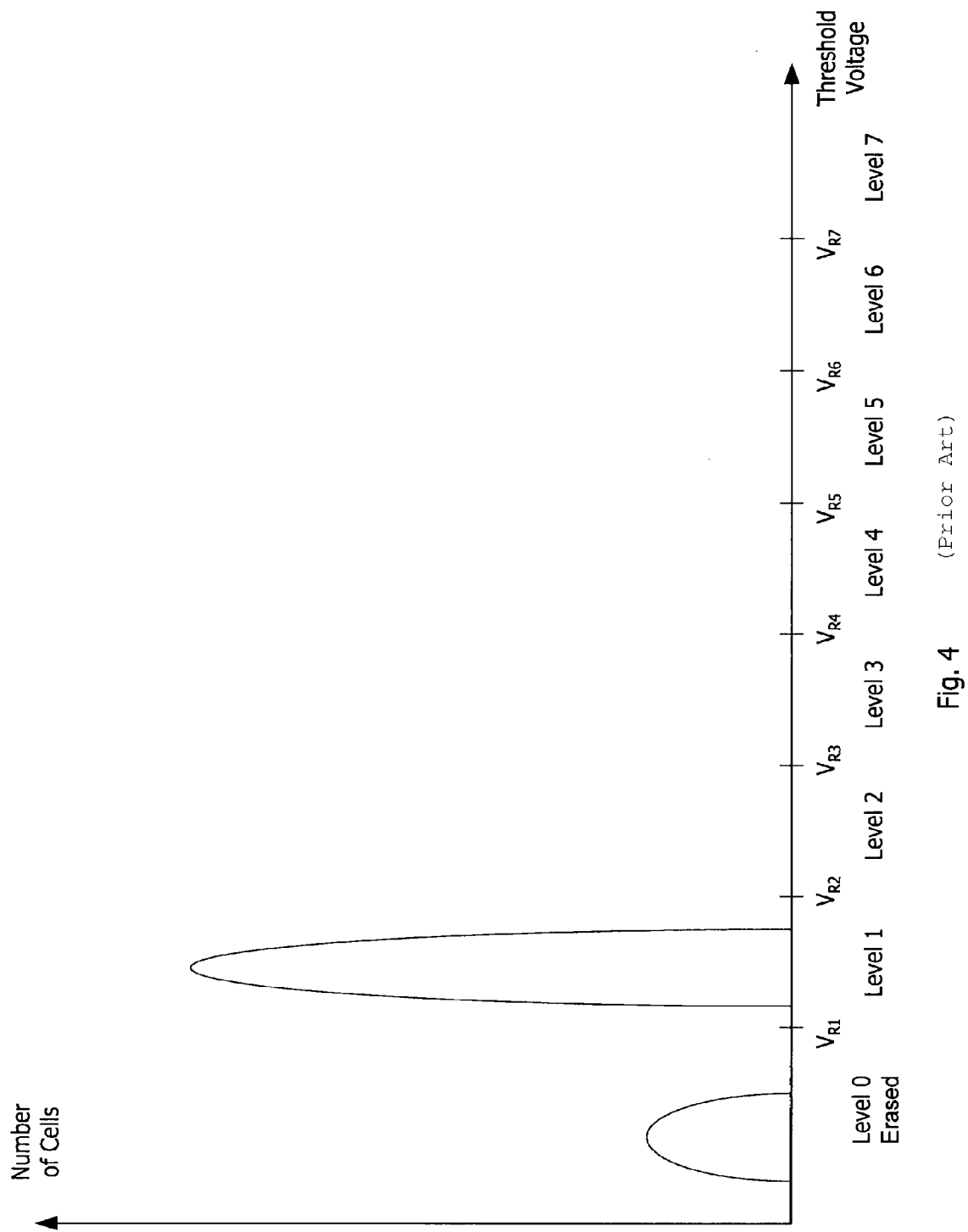
Figure 5:
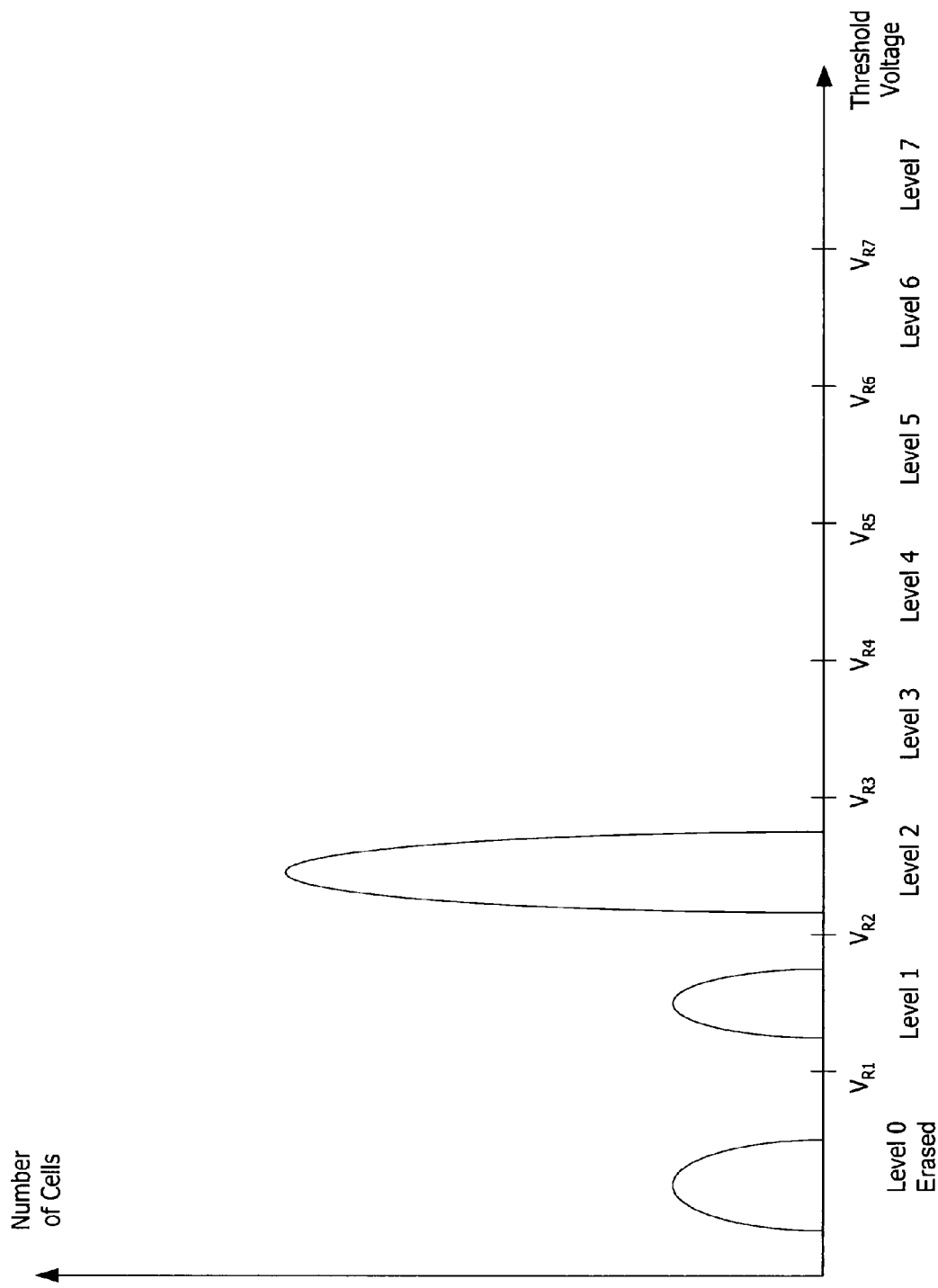
Figure 6:
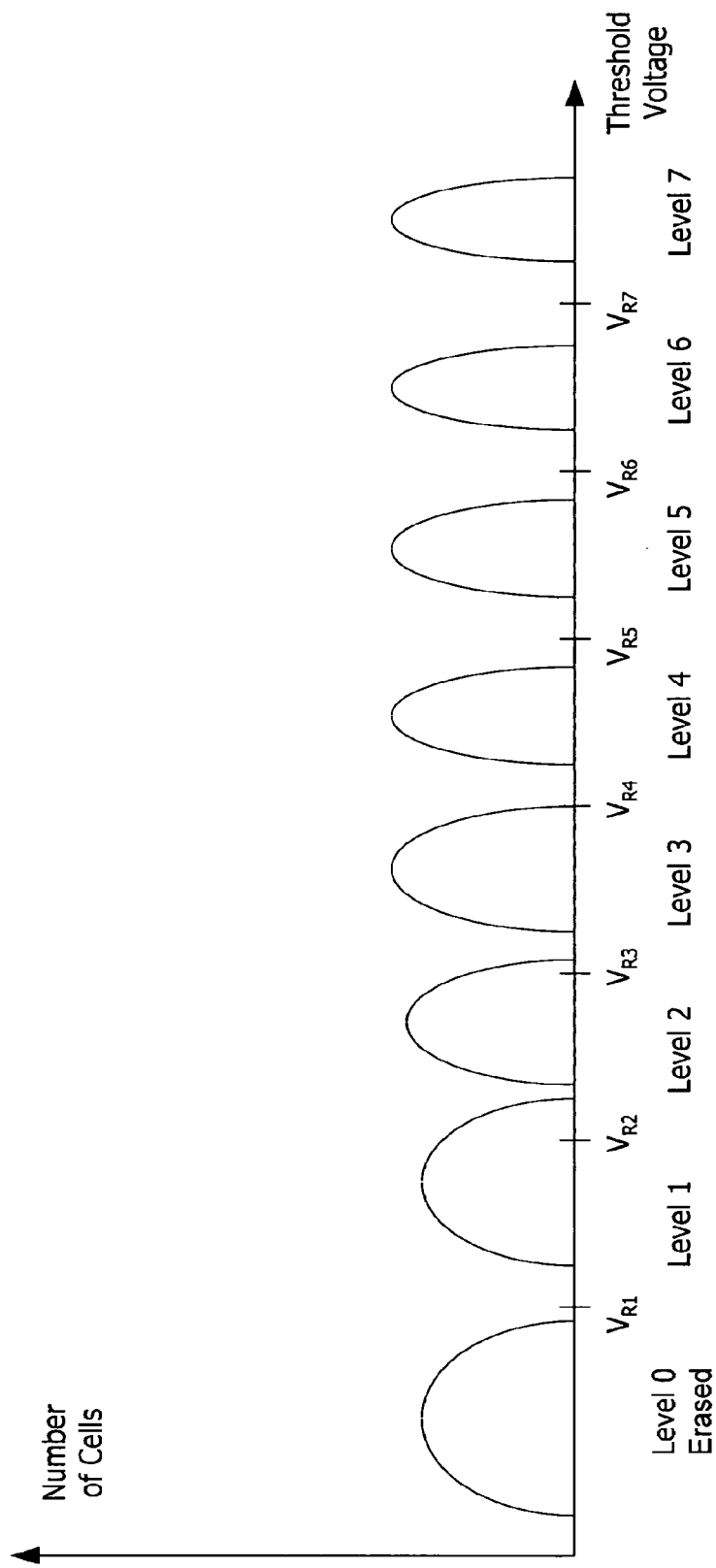
Figure 12:
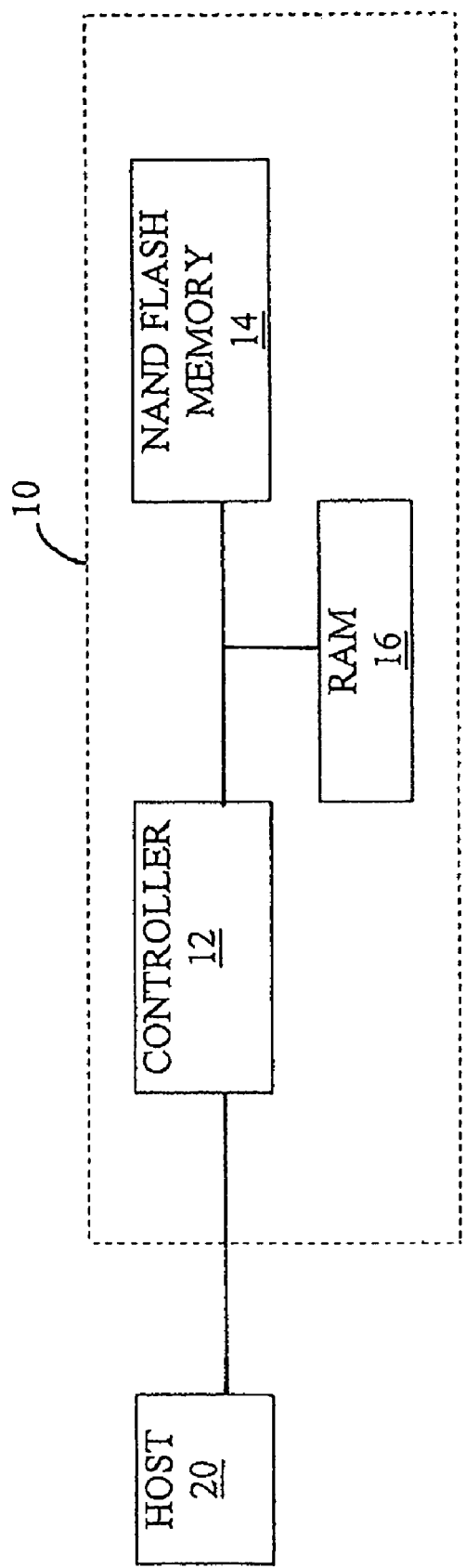
FIG. 12 is a high-level block diagram of a memory device of the present invention.

FIG. 12 is a high-level block diagram of a flash memory device 10 of the present invention, coupled to a host 20. FIG. 2 is adapted from Ban, U.S. Pat. No. 5,404,485, which patent is incorporated by reference for all purposes as if fully set forth herein. Flash memory device 10 includes a NAND flash memory 14 that includes blocks of cells such as the block illustrated in FIG. 1, a controller 12 and a random access memory (RAM) 16. Controller 12, that corresponds to "flash control 14" of U.S. Pat. No. 5,404,485, manages flash memory 14 with the help of RAM 16, as described in U.S. Pat. No. 5,404,485 and in U.S. Pat. No. 5,937,425, which also is incorporated by reference for all purposes as if fully set forth herein. In addition, upon receiving two or more pluralities of bits from host 20 to store in a wordline of flash memory 14, controller 12 first stores the bits in RAM 16. Then controller 12 transfers the bits to the target wordline of flash memory 14. In the first programming phase, the threshold voltages of some of the cells of the wordline are raised to values above a verify voltage that distinguishes cells that store most significant "0" bits from cells that store most significant "1" bits. In the second programming phase, the threshold voltages of many of the remaining cells are raised to values below this verify voltage. Each of the cells of the wordline stores one bit from each of the pluralities received from host 20.

Figure 13:
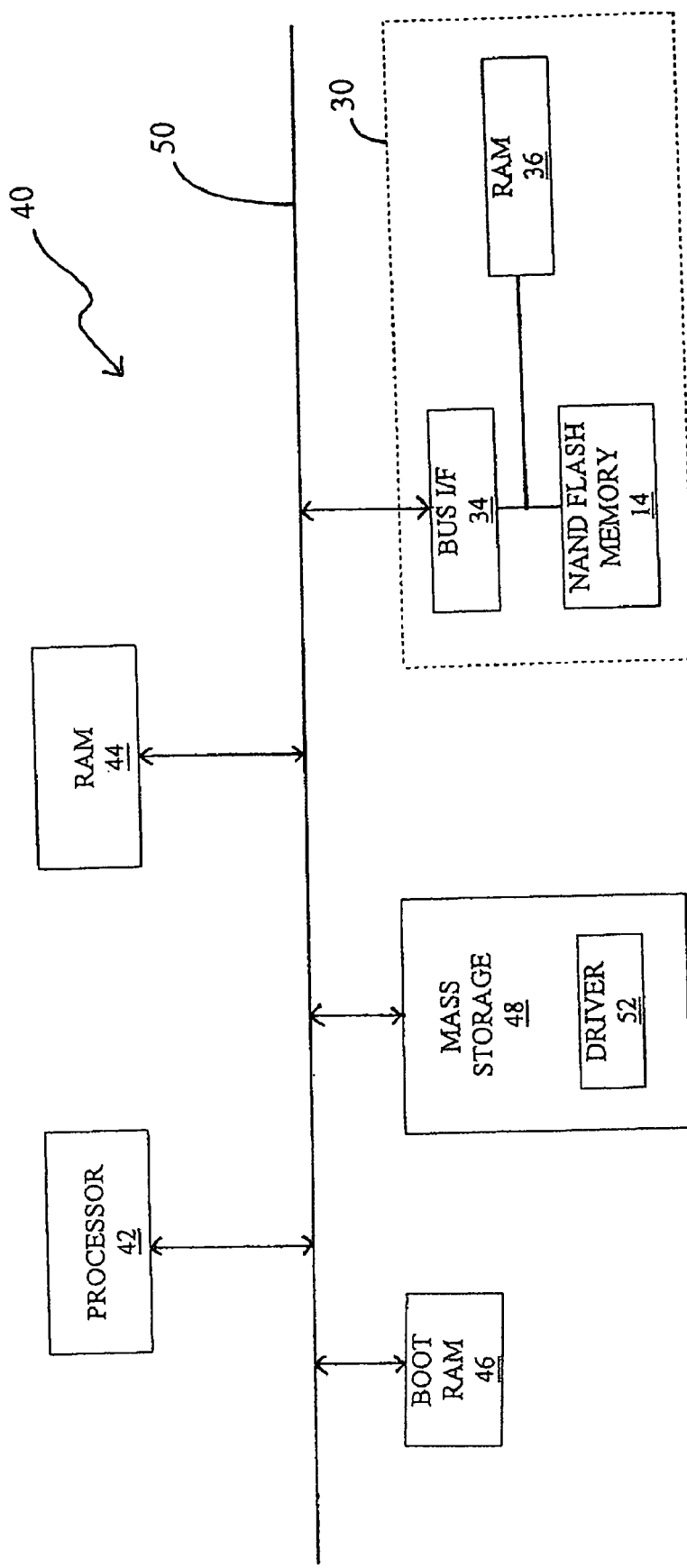
FIG. 13 is a partial high-level block diagram of a data storage system of the present invention.

FIG. 13 is a high-level partial block diagram of an alternative data storage system 40 of the present invention. Data storage system 40 includes a processor 42 and four memory devices: a RAM 44, a boot ROM 46, a mass storage device (hard disk) 48 and a flash memory device 30, all communicating via a common bus 50. Like flash memory device 10, flash memory device 30 includes a NAND flash memory 32 that includes blocks of cells such as the block illustrated in FIG. 1, and also an internal RAM 36. Unlike flash memory device 10, flash memory device 30 lacks its own controller. Instead, processor 42 emulates controller 12 by executing a software driver 52 that implements the methodology of U.S. Pat. No. 5,404,485 and U.S. Pat. No. 5,937,425 and that also implements the multi-bit programming methodology of the present invention. Specifically, software driver 52 includes a write function that, when invoked by an application executed by processor 42 to write a wordline's worth of data bits to a wordline of flash memory 32, first stores all the bits in RAM 36 and then transfers the bits to the target wordline of flash memory 32 as described above for flash memory device 10. The code of software driver 52 is stored in mass storage device 48 and is loaded into RAM 44 for execution. Flash memory device 30 also includes a bus interface 34 to enable processor 42 to communicate with flash memory 32 and RAM 36.

While the invention has been described with respect to a limited number of embodiments, it will be appreciated that many variations, modifications and other applications of the invention may be made.

What is claimed is:

1. A method of storing data in a memory device comprising memory cells comprising:
    (a) programming a first set of the memory cells to a first threshold voltage level, which is not a highest threshold voltage level for the memory cells of the memory device, for storing a first most significant bit pattern of a number of bits wherein the number of bits of the first most significant bit pattern is at least two bits; and programming a second set of the memory cells to a second threshold voltage level, which is at least two threshold voltage levels below the first threshold voltage level, for storing a second most significant bit pattern of the same number of bits as the first most significant bit pattern; and
    (b) after performing step (a), programming a first subset of the first set of memory cells to a third threshold voltage level which is higher than the first threshold voltage level for storing a first least significant bit pattern of a number of bits, and programming a second subset of the second set of memory cells to a fourth threshold voltage level, which is higher than the second threshold voltage level and less than the first threshold voltage level for storing a second least significant bit pattern of the same number of bits as the first least significant bit pattern.

2. The method of claim 1, wherein the first least significant bit pattern has one bit as the number of bits.

3. A method of storing data in a memory device, comprising:

(a) receiving, from a host of the memory device, at least a first page of bits and a second page of bits to store in a plurality of cells of a nonvolatile memory of the memory device;

(b) storing said at least first page and second page of bits in a volatile memory of the memory device; and (c) subsequent to said storing of said at least first page and second page of bits in said volatile memory, each one of said plurality of cells of the nonvolatile memory storing at least one bit of each of at least said first page and at least said second page, by steps including:

(i) programming a first set of the plurality of cells to a first threshold voltage level, which is not a highest threshold voltage level for the plurality of cells of the memory device, for storing a first most significant bit pattern of a number of bits wherein the number of bits of the first most significant bit pattern is at least two bits, and programming a second set of the plurality of cells to a second threshold voltage level, which is at least two threshold voltage levels below the first threshold voltage level, for storing a second most significant bit pattern of the same number of bits as the first most significant bit pattern, and (ii) after performing step (i), programming a first subset of the first set of the plurality of cells to a third threshold voltage level which is higher than the first threshold voltage level for storing a first least significant bit pattern of a number of bits, and programming a second subset of the second set of the plurality of cells to a fourth threshold voltage level, which is higher than the second threshold voltage level and less than the first threshold voltage level for storing a second least significant bit pattern of the same number of bits as the first least significant bit pattern.

4. The method of claim 3, wherein said cells are in different physical pages and share a common word line of said nonvolatile memory.

5. The method of claim 3, wherein the first least significant bit pattern has one bit as the number of bits.

6. The method of claim 3, wherein
programming the first set of the plurality of cells to the first threshold voltage level, which is not a highest threshold voltage level for storing the first most significant bit pattern, and programming the second set of the plurality of cells to the second threshold voltage level, which is at least two threshold voltage levels below the first threshold voltage level, for storing the second most significant bit pattern are performed simultaneously.

7. The method of claim 3, wherein the first set of the plurality of cells and the second set of the plurality of cells are in a first physical page of the plurality of cells, the method further comprising:
receiving, from the host of the memory device, at least a third page of bits and a fourth page of bits to store in a second physical page of the plurality of cells of the nonvolatile memory of the memory device;
receiving, from the host of the memory device, at least a fifth page of bits and a sixth page of bits to store in the first and second physical pages of the plurality of cells of the nonvolatile memory of the memory device as bits of the first least significant bit pattern and the second least significant bit pattern;
storing said at least third page, fourth page, fifth page and sixth page of bits in a volatile memory of the memory device; and
subsequent to said storing of said at least third page and fourth page of bits in said volatile memory, each one of said plurality of cells in the second physical page of the nonvolatile memory storing at least one bit of each of at least said third page and at least said fourth page, by steps including:
prior to performing step (ii), programming a first set of the plurality of cells in the second physical page to a first threshold voltage level, which is not a highest threshold voltage level for the plurality of cells of the memory device, for storing a first most significant bit pattern of a number of bits wherein the number of bits of the first most significant bit pattern is at least two bits, and programming a second set of the plurality of cells in the second physical page to a second threshold voltage level, which is at least two threshold voltage levels below the first threshold voltage level, for storing a second most significant bit pattern of the same number of bits as the first most significant bit pattern;
wherein step (ii) further comprises
programming a first subset of each first set of the plurality of cells in the first and second physical pages to a third threshold voltage level which is higher than the first threshold voltage level for storing a first least significant bit pattern of a number of bits, and programming a second subset of each second set of the plurality of cells in the first and second physical pages to a fourth threshold voltage level, which is higher than the second threshold voltage level and less than the first threshold voltage level for storing a second least significant bit pattern of the same number of bits as the first least significant bit pattern.

8. The method of claim 7, wherein programming the first subset of each first set of the plurality of cells in the first and second physical pages to the third threshold voltage level for storing the first least significant bit pattern, and programming the second subset of each second set of the plurality of cells in the first and second physical pages to the fourth threshold voltage level for storing the second least significant bit pattern are performed simultaneously.

9. A memory device comprising:
a nonvolatile memory that includes a plurality of cells;
a volatile memory; and
a controller operative, in response to receiving, from a host of the memory device, bits to store in the memory device:
(i) to store bits in said volatile memory, and
(ii) subsequent to said storing of said bits in said volatile memory: to store said bits in said plurality of cells by:
(A) programming a first set of the plurality of cells to a first threshold voltage level, which is not a highest threshold voltage level for the plurality of cells of the memory device, for storing a first most significant bit pattern of a number of bits wherein the number of bits of the first most significant bit pattern is at least two bits, and programming a second set of the plurality of cells to a second threshold voltage level, which is at least two threshold voltage levels below the first threshold voltage level, for storing a second most significant bit pattern of the same number of bits as the first most significant bit pattern, and
(B) after performing step (A), programming a first subset of the first set of the plurality of cells to a third threshold voltage level which is higher than the first threshold voltage level for storing a first least significant bit pattern of a number of bits, and programming a second subset of the second set of the plurality of cells to a fourth threshold voltage level, which is higher than the second threshold voltage level and less than the first threshold voltage level for storing a second least significant bit pattern of the same number of bits as the first least significant bit pattern;

wherein said bits include a first page of bits associated with a first command received from the host and a second page of bits associated with a second command received from the host, at least one bit of each of said first page and said second page is stored in each one of said cells.

10. The memory device of claim 9, wherein said nonvolatile memory is a NAND flash memory.

11. The memory device of claim 9, wherein said cells are in different pages and share a common word line of said nonvolatile memory.

12. The memory device of claim 9, wherein the first least significant bit pattern has one bit as the number of bits.

* * * * *